(12) United States Patent
Kim et al.

(10) Patent No.: US 7,132,862 B2
(45) Date of Patent: Nov. 7, 2006

(54) ANALOG BUFFER AND METHOD FOR DRIVING THE SAME

(75) Inventors: Kee-Jong Kim, Seoul (KR); Juhn-Suk Yoo, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 15 days.

(21) Appl. No.: 10/879,096

(22) Filed: Jun. 30, 2004

(65) Prior Publication Data

US 2005/0140399 A1 Jun. 30, 2005

(30) Foreign Application Priority Data

Dec. 29, 2003 (KR) .................... 10-2003-0099383

(51) Int. Cl.
*G01C 27/02* (2006.01)
(52) U.S. Cl. ........................ 327/95; 327/108
(58) Field of Classification Search ................. 327/91, 327/94, 95
See application file for complete search history.

(56) References Cited

U.S. PATENT DOCUMENTS

| | | | | |
|---|---|---|---|---|
| 5,410,269 | A * | 4/1995 | Ohie et al. | 327/91 |
| 5,920,209 | A * | 7/1999 | Kusumoto et al. | 327/91 |
| 2005/0140625 | A1* | 6/2005 | Kim et al. | 345/89 |

\* cited by examiner

*Primary Examiner*—Long Nguyen
(74) *Attorney, Agent, or Firm*—McKenna Long & Aldridge LLP

(57) ABSTRACT

In an analog buffer and a method for driving the same, by providing a pair of switches at a last comparing unit, a voltage level of an output signal is precharged as high as a source voltage level during a first offset period in an Nth initializing period, the voltage level of the output signal is discharged as high as a voltage level of a desired data signal during a discharging period in an Nth signal-applied period, then, the discharged voltage of the output signal, which overshoots a desired data voltage is compensated during a second offset period in the Nth signal-applied period to thereby output an accurate data voltage. In addition, by providing the pair of switches at the last comparing unit, a voltage level of an output signal is discharged to a ground potential during a first offset period in an N+1th initializing period, the voltage level of the output signal is charged as high as a voltage level of the desired data signal during a charging period of an N+1th signal-applied period, then the charged voltage of the output signal, which overshoots a desired data voltage, is compensated during a second offset period to thereby output an accurate data voltage. Accordingly, by the analog buffer and the method for driving the same, a flat panel display device driven by an inversion method can correctly implement a desired color, and thus its image quality can be improved.

13 Claims, 4 Drawing Sheets

ANALOG BUFFER AND METHOD FOR DRIVING THE SAME

This application claims the benefit of Korean Patent Application No. 2003-99383, filed on Dec. 29, 2003, which is hereby incorporated by reference for all purposes as if fully set forth herein.

BACKGROUND OF THE INVENTION

1. Field of the Invention

The present invention relates to an analog buffer and a method for driving the same, and more particularly, to an analog buffer and a method for driving the same capable of reducing power consumption and reliably supplying an output voltage in driving a signal line of a flat panel display device.

2. Description of the Related Art

In general, thin film type flat panel display devices with screens displaying image information have been actively developed in recent years because they are light weight and can be easily used anywhere. Particularly, research into liquid crystal display (LCD) devices is actively ongoing because of their high resolution and a fast reaction speed in order to implement a dynamic image.

By artificially controlling an alignment direction of liquid crystal molecules having a directional characteristic to affect polarization, the liquid crystal display device can transmit or block light by optical anisotropy according to the alignment direction of a liquid crystal. By using this property, the liquid crystal display device may be used as a flat panel display device. Active matrix LCDs with a plurality of pixels arranged in a matrix display image information that is selectively provided to each pixel through a switching element such as a thin film transistor (TFT) provided at each pixel. Active matrix LCDs are being used most generally because they provide excellent image quality.

A substrate used for the liquid crystal display device is made of a transparent material which transmits light, such as a glass material which is low cost and easily processed.

If the transistor is made of a polycrystalline silicon material having high electron mobility, it has a fast switching speed, and it can be designed to be small. However, because polycrystalline silicon is typically formed using a high temperature process, it cannot be formed on a glass substrate of the liquid crystal display device.

In this, the thin film transistor applied on the glass substrate of the liquid crystal display device is made of an amorphous silicon material.

A driving unit of the liquid crystal display device is formed of a plurality of integrated circuits (IC) having fast switching speeds and small-sized transistors integrated at a high density because many switching elements are required in order to process a digital signal.

Accordingly, the transistors used in the driving unit of the liquid crystal display device should be made of a polycrystalline silicon material formed by a high temperature process.

As mentioned above, the thin film transistor applied to the substrate of the liquid crystal display device is made of an amorphous silicon material by a low temperature process, and the transistor applied to the driving unit of the liquid crystal display device is made of a polycrystalline silicon material formed by a high temperature process.

Accordingly, the driving unit of the liquid crystal display device includes a plurality of integrated circuits which are individually fabricated on a separate single crystal silicon substrate and a tape carrier package (TCP) on which the integrated circuits are mounted, and the driving unit is connected to a substrate of a liquid crystal display device by a tape automated bonding (TAB) method. Alternatively, the driving unit includes a plurality of integrated circuits which are individually fabricated on a separate single crystal silicon substrate and is mounted on the substrate of the liquid crystal display device by a chip-on-glass (COG) method to be coupled to the substrate.

However, in case where the driving unit of the liquid crystal display device is coupled to the substrate by the TAB method or the chip-on-glass method, the miniaturization and the simplification of the liquid crystal display device is limited because the space occupied by the driving unit of the liquid crystal display device is required. As lines for transmitting driving signals are increased in number and length, various noise, electromagnetic interference (EMI) or the like are generated, thereby degrading the reliability and increasing the fabrication cost of the liquid crystal display device.

Therefore, research into forming the polycrystalline silicon by a low temperature process have been recently developed so that it has become possible to make a thin film transistor fabricated on a substrate of the liquid crystal display device by using a polycrystalline silicon material. Accordingly, a driving circuit-integrated liquid crystal display device in which the driving unit is formed on a substrate of the liquid crystal display device has been proposed.

FIG. 1 is an exemplary view showing a schematic structure of the driving circuit-integrated liquid crystal display device.

Referring to FIG. 1, the liquid crystal display device includes a liquid crystal display panel 10 in which gate lines located at regular intervals and arranged horizontally and data lines 30 located at regular intervals and arranged vertically cross, and pixels 40 are formed in a square area formed as the gate lines 20 and the data lines 30 cross; a gate driving unit 50 mounted on the liquid crystal display panel 10, for applying a scan signal to the gate lines 20; and a data driving unit 60 mounted on the liquid crystal display panel 10, for applying a data signal to the data lines 30.

A pixel electrode and a thin film transistor are provided at each pixel 40. The thin film transistor includes a gate electrode connected to the gate line 20; a source electrode connected to the data line 30; and a drain electrode connected to the pixel electrode.

A gate pad part and a data pad part are formed at one end of gate lines 20 and data lines 30.

The gate driving unit 50 sequentially applies a scan signal to the gate lines 20 through the gate pad part, and the data driving unit 60 applies a data signal to the data lines 30 through the data pad part, so that pixels 40 of the liquid crystal display panel 10 are individually driven, and thus a desired image is displayed on the liquid crystal display panel 10.

The gate driving unit 50 and the data driving unit 60 mounted at the liquid crystal display panel 10 are simultaneously fabricated in a process for fabricating a thin film transistor array substrate of the liquid crystal display panel 10.

As liquid crystal display devices are developed with high resolution and large size, the data lines and the gate lines increase in number and length, thereby increasing a load on the driving circuit. The same is true with respect to the number of data signals which are processed in order to drive the liquid crystal display device. Therefore, the driving unit of the liquid crystal display device has to be driven at a faster speed. However, due to the increased load on the data lines and the gate lines, a desired signal cannot be applied within a short period of time.

Accordingly, large-sized and high resolution liquid crystal display devices necessarily require an analog buffer which can apply a desired signal within a short period of time, corresponding to the load of the data lines and the gate lines.

In general, because transistors with a single crystal silicon material have fine electrical property differences, an operational amplifier is designed and so can be applied as the analog buffer. On the contrary, because transistors with a polycrystalline silicon material have great electrical property differences, an operational amplifier designed with the polycrystalline silicon transistors has a great offset voltage and consumes a large amount of power due to a static current. For this reason, it is difficult to apply the operation amplifier of the polycrystalline silicon material as the analog buffer.

Accordingly, the driving circuit-integrated liquid crystal display device requires an analog buffer that is insensitive to electrical property differences of the transistors made of polycrystalline silicon material, has a simple structure so as to reduce an area occupied thereby and consumes a small amount of power.

The conventional analog buffer as mentioned above will now be described in detail with reference to the accompanying drawings.

FIG. 2 is an exemplary view showing a conventional analog buffer. The analog buffer includes a comparing unit (COMP1) for calibrating a voltage change of an output signal (OUT_SIG) applied to a data line upon receiving an analog signal (ANALOG_SIG) through a first switch (SW1) and a first capacitor (C1); a second switch (SW2) connected between an input terminal and an output terminal of the comparing unit (COMP1); and a third switch (SW3) connected to the output terminal of the comparing unit (COMP1) and between the first switch (SW1) and the first capacitor (C1).

The first switch (SW1) and the second switch (SW2) are simultaneously turned on and off by a first control signal (CS1), and the third switch (SW3) is turned on and off by a second control signal.

FIG. 3 is a wave form view of an analog buffer illustrated in FIG. 2, and a drive of the conventional analog buffer will now be described in detail with reference thereto.

First, during an initializing period the first control signal (CS1) is applied with a high potential, the first switch (SW1) is turned on so that an analog signal (ANALOG_SIG) is charged at a first capacitor (C1), and the second (SW2) is also turned on so that an input terminal and an output terminal of the comparing unit (COMP1) are initialized. At this time, because the second control signal (CS2) is at a low potential, the third switch (SW3) is turned off.

Accordingly, a voltage (Vana−Vth) obtained by subtracting a threshold voltage (Vth) of the comparing unit (COMP1) from a voltage value (Vana) of the analog signal (ANALOG_SIG) is charged at the first capacitor (C1) during the initializing period.

The third switch (SW3) is turned on when the second control signal (CS2) is set to a high potential, so that a voltage (Vana) of the analog signal (ANALOG_SIG) is applied to a data line (D1) as an output signal (OUT_SIG) through the turned-on third switch (SW3). At this time, because the first control signal (CS1) is set to a low potential, the first switch (SW1) and the second switch (SW2) are turned off.

In order to calibrate an error due to electrical property differences of transistors in the comparing unit (COMP1), during the initializing period, the conventional analog buffer driven as above stores an offset voltage at the first capacitor (C1) and simultaneously initializes the input terminal and the output terminal of the comparing unit (COMP1).

A voltage value (Vana) of the analog signal (ANALOG_SIG) is applied to a data line (D1) as an output signal (OUT_SIG) through the turned-on third switch (SW3) during the signal-applied period.

When a voltage of an output signal (OUT_SIG) applied to the data line (D1) is changed, the comparing unit (COMP1) changes a voltage of the input terminal to pull up or pull down a voltage value (Vana) of the analog signal (ANALOG_SIG), together with the first capacitor (C1).

That is, when a voltage of an output signal (OUT_SIG) applied to the data line (D1) is raised, a voltage of the input terminal of the comparing unit (COMP1) is dropped, and the comparing unit (COMP1) pulls down a voltage value (Vana) of the analog signal (ANALOG_SIG), together with the first capacitor (C1). On the contrary, when a voltage of the output signal (OUT_SIG) applied to the data line (D1) is dropped, a voltage of the input terminal of the comparing unit (COMP1) is raised, and the comparing unit (COMP1) pulls up a voltage value (Vana) of the analog signal (ANALOG_SIG) together with the first capacitor (C1).

The voltage value (Vana) of the analog signal (ANALOG_SIG) pulled up or down as above is applied to the data line (D1) as an output signal (OUT_SIG) through the third switch (SW3). Thus, a voltage change of the output signal (OUT_SIG) is calibrated, and the calibrated voltage is applied to the data line (D1).

However, because the conventional analog buffer above is driven in a state that an offset voltage is applied to the input terminal of the comparing unit (COMP1), a leakage current flows from the comparing unit (COMP1). In the case of a high resolution, large-sized liquid crystal display device, in which a load of a data line (D1) connected to an output terminal of the comparing unit (COMP1) is large, the comparing unit (COMP1) has to be designed to be big, thereby increasing a leakage current and thus increasing power consumption.

In addition, by controlling the voltage at an input terminal of the comparing unit (COMP1) according to a voltage change of the output signal (OUT_SIG) applied to the data line (D1) and applying the voltage as an output signal (OUT_SIG), a voltage change of the output signal (OUT_SIG) is calibrated. Accordingly, an output signal, the voltage change of which has been calibrated, may overshoot a voltage value of the data signal, and thus a desired color image may not be displayed on a flat panel display device.

SUMMARY OF THE INVENTION

Therefore, an advantage of the present invention is to provide an analog buffer and a method for driving the same capable of reducing power consumption and reliably supplying an output voltage to drive a signal line of a flat panel display device.

To achieve these and other advantages and in accordance with the purpose of the present invention, as embodied and broadly described herein, there is provided an analog buffer including a first comparing unit for calibrating a voltage change of an output terminal upon receiving an analog signal through a first switch and a first capacitor; a second switch connected between an input terminal and the output terminal of the first comparing unit; a second comparing unit for calibrating a voltage change of an output terminal upon receiving an output signal of the first comparing unit through a second capacitor; a third switch connected between an input terminal and the output terminal of the second comparing unit; a third comparing unit for calibrating a voltage change of an output signal applied to a line upon receiving an output signal of the second comparing unit; a fourth switch connected to an output terminal of the third comparing unit and between the first switch and the first capacitor; and fifth and sixth switches for respectively supplying a source voltage and a ground potential to the third comparing unit or cutting off the source voltage and the ground potential.

The foregoing and other features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings.

Figure 1:
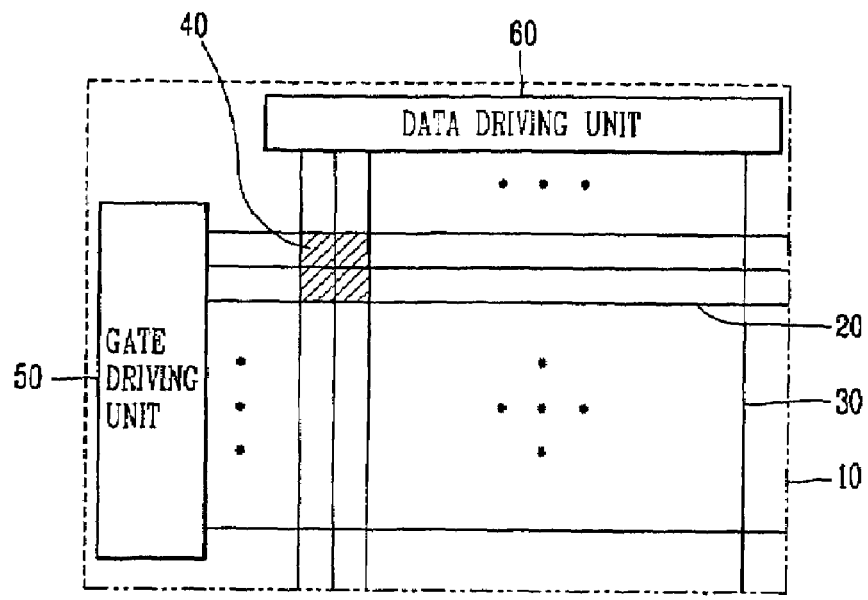
FIG. 1 is an exemplary view showing a schematic structure of a driving circuit-integrated liquid crystal display device.
Figure 2:
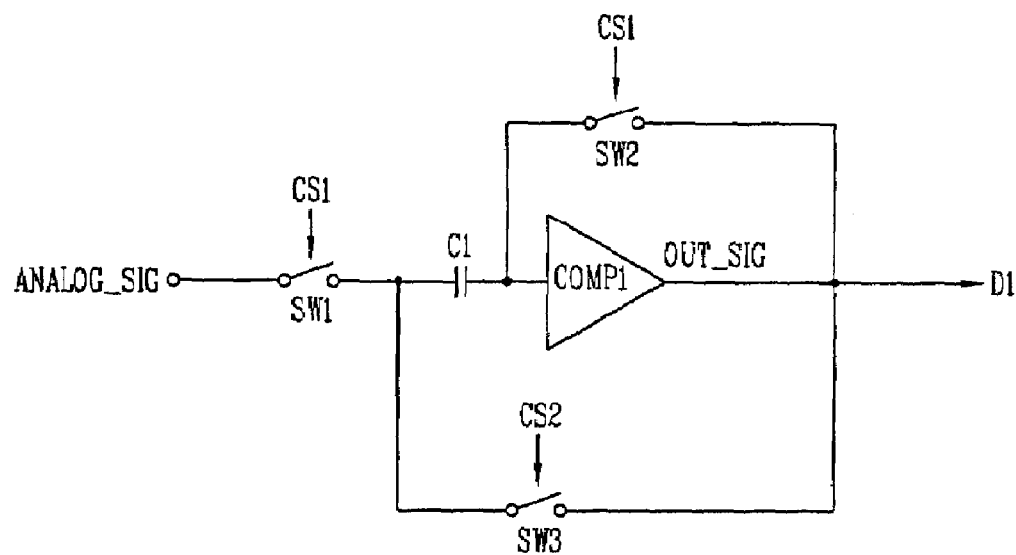
FIG. 2 is an exemplary view showing a conventional analog buffer.
Figure 3:
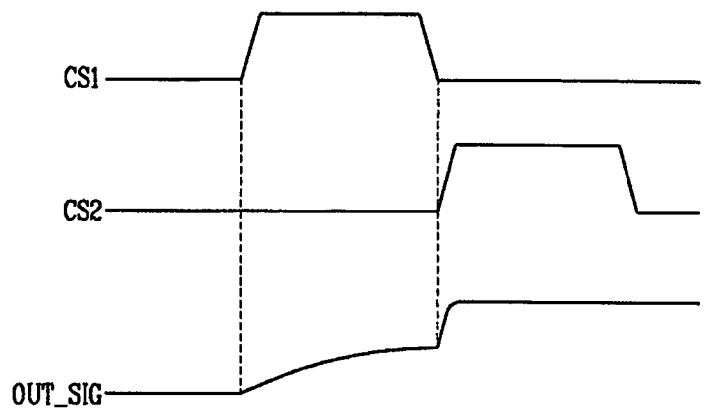
FIG. 3 is a view showing wave forms for first and second control signals and an output signal in FIG. 2.
Figure 4:
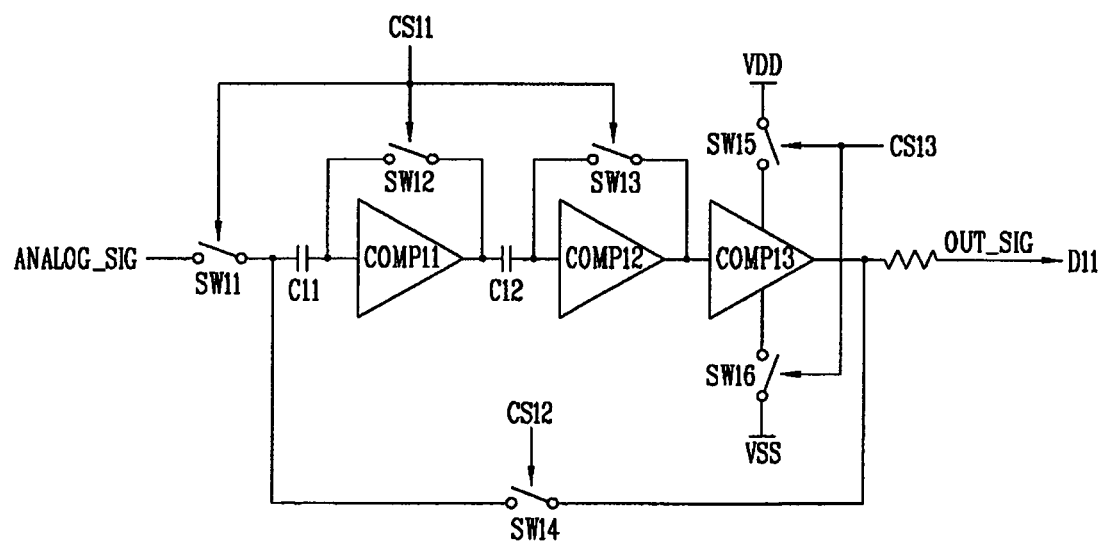
FIG. 4 is an exemplary view showing an analog buffer in accordance with the present invention.

FIG. 4 is an exemplary view showing an analog buffer in accordance with the present invention.

As shown therein, an analog buffer in accordance with the present invention includes: a first comparing unit (COMP11) for calibrating a voltage change of an output terminal upon receiving an analog signal (ANALOG_SIG) through a first switch (SW11) and a first capacitor (C11); a second switch (SW12) connected between an input terminal and an output terminal of the first comparing unit (COMP11); a second comparing unit (COMP12) for calibrating a voltage change of an output terminal upon receiving an output signal of the first comparing unit (COMP11) through a second capacitor (C12); a third switch (SW13) connected between an input terminal and an output terminal of the second comparing unit (COMP12); a third comparing unit (COMP13) for calibrating a voltage change of an output signal (OUT_SIG) applied to a data line (D11) upon receiving an output signal of the second comparing unit (COMP12); a fourth switch (SW14) connected to an output terminal of the third comparing unit (COMP13) and between the first switch (SW11) and the first capacitor (C11); and fifth and sixth switches (SW15, SW16) for respectively supplying a source voltage (VDD) and a ground potential (VSS) to the third comparing unit (COMP13) or cutting off the source voltage (VDD) and the ground potential (VSS).

The first to third switches (SW11–SW13) are simultaneously turned on or off by a first control signal (CS11), the fourth switch (SW14) is turned on or off by a second control signal (CS12), and the fifth and sixth switches (SW15, SW16) are alternately turned on or off by a third control signal (CS13).

The first to third switches (SW11–SW13) may be transistors which are simultaneously turned on or off upon receiving the first control signal (CS11) at their gate electrodes, the fourth switch (SW14) may be a transistor which is turned on or off upon receiving a second control signal (CS12) at its gate electrode, and the fifth and sixth switches (SW15, SW16) may be transistors which are alternately turned on or off by a third control signal (CS13). At this time, the first to fourth switches (SW11–SW14) and the sixth switch (SW16) may be an N-type MOS transistor, and the fifth switch (SW15) may be a P-type MOS transistor. Further, the first to third comparing units (COMP11–COMP13) may be an inverter, a voltage amplifier or the like.

A resistance element for preventing a noise from occurring in an output signal (OUT_SIG) of the third comparing unit (COMP13) may be additionally provided between an output terminal of the third comparing unit (COMP13) and a data line (D11).

Figure 5:
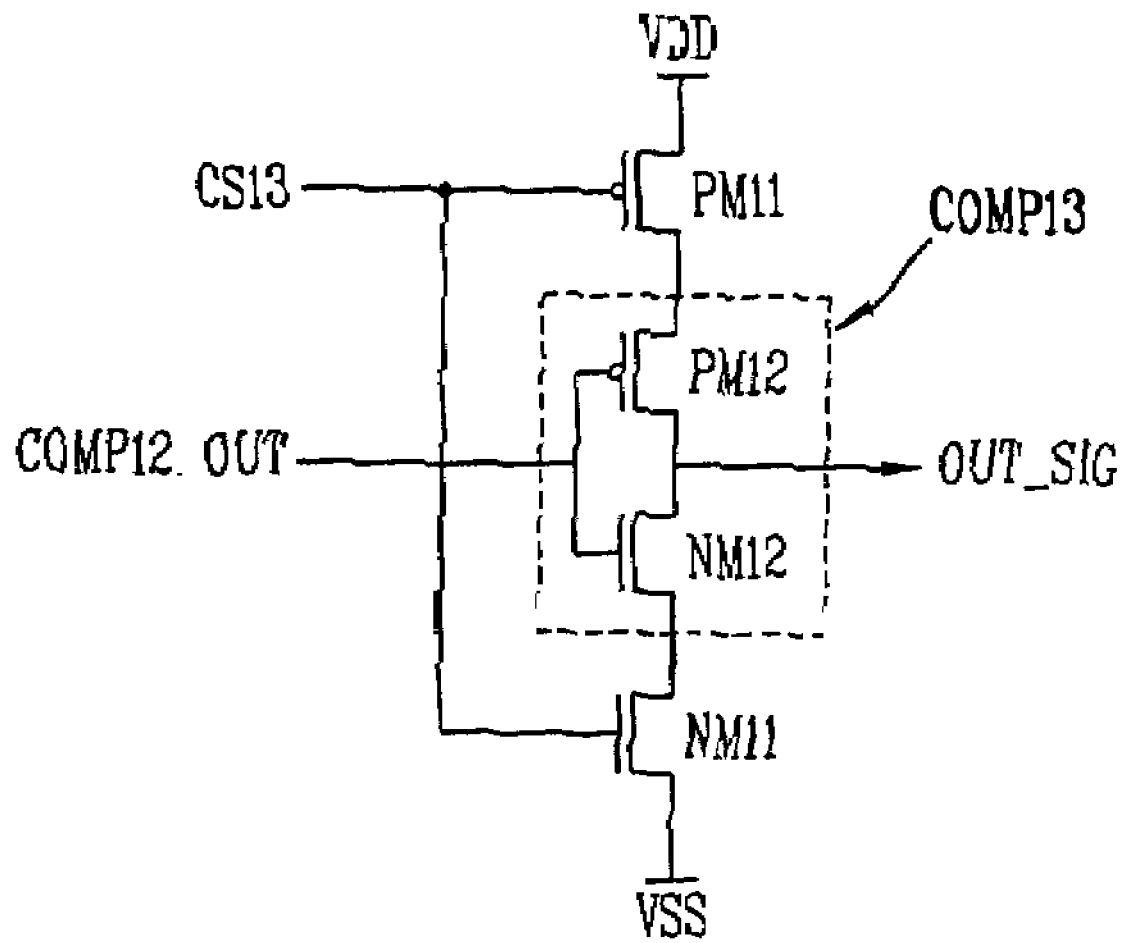
FIG. 5 is an exemplary view showing a third comparing unit FIG. 4 in more detail.

FIG. 5 is an exemplary view showing the third comparing unit (COMP13) of FIG. 4 in more detail.

Referring to FIG. 5, one side of the third comparing unit (COMP13) is connected to a source voltage (VDD) through a first P-type MOS transistor (PM11) receiving a third control signal at its gate electrode, and the other side of the third comparing unit (COMP13) is connected to a ground potential (VSS) through a first N-type MOS transistor (NM11) receiving the third control signal at its gate electrode.

The third comparing unit (COMP13) includes a second P-type MOS transistor (PM12) and a second N-type MOS transistor (NM12) which are connected in series between the first P-type MOS transistor (PM11) and the first N-type MOS transistor (NM11) and receiving an output signal (COMP12_OUT) of the second comparing unit (COMP12) of FIG. 4 at their gate electrodes. An output signal (OUT_SIG) is outputted from a drain connection point of the second P-type MOS transistor (PM12) and the second N-type MOS transistor (NM12).

Figure 6:
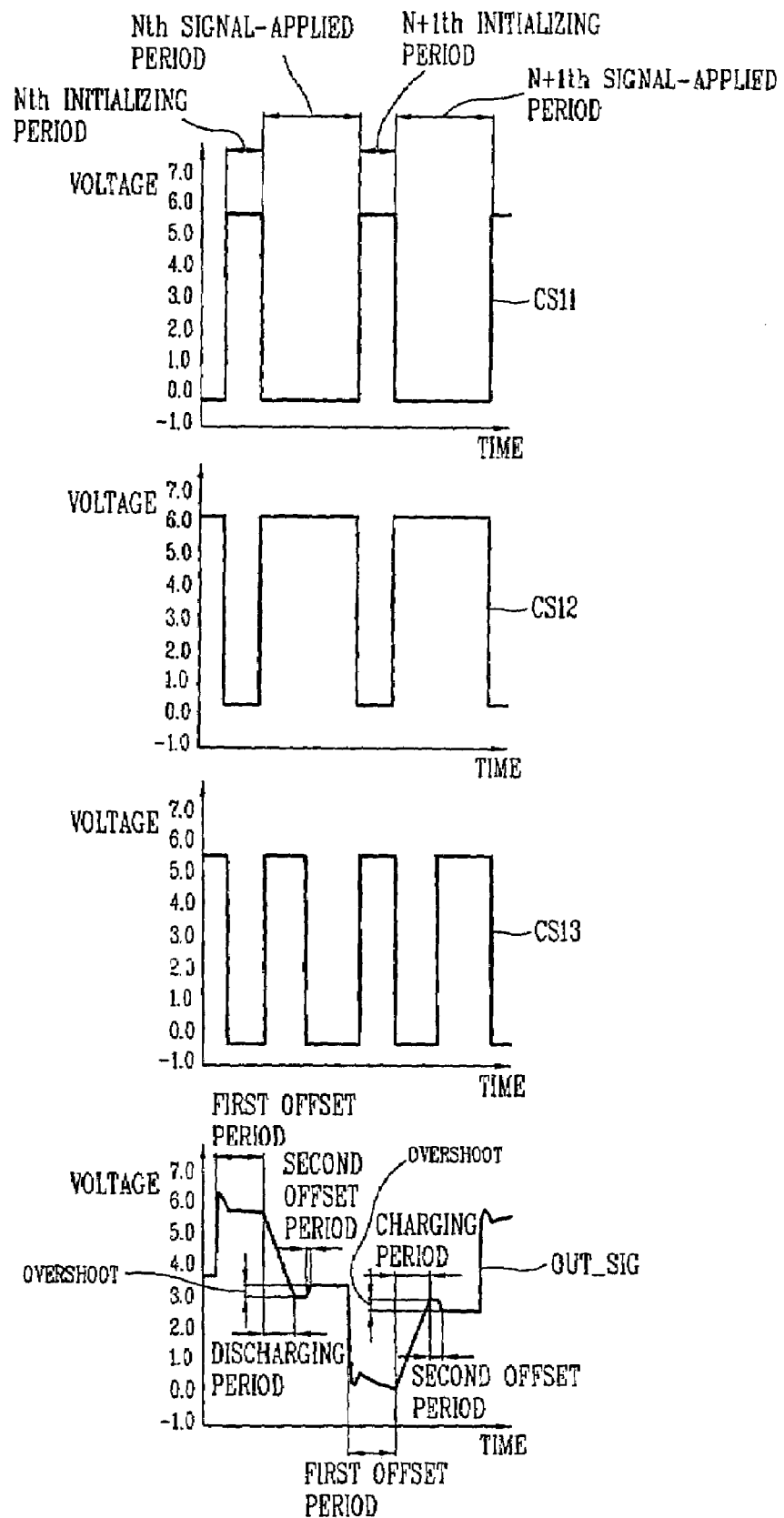
FIG. 6 is a wave form view according to a simulation result of an analog buffer illustrated in FIG. 4.

FIG. 6 is a wave form view according to a simulation result of an analog buffer illustrated in FIG. 4. Referring to this, driving of the analog buffer in accordance with the present invention will now be described in detail.

First, during an Nth initializing period that the first control signal (CS11) is applied as a high potential, the first switch (SW11) is turned on so that an analog signal (ANALOG_SIG) is charged at the first capacitor (C11), and the second switch (SW12) is turned on so that the input terminal and the output terminal of the first comparing unit (COMP11) are initialized.

In addition, as the second switch (SW12) is turned on, an analog signal (ANALOG_SIG) is charged onto the second capacitor (C12), and the third switch (SW13) is turned on so that the input terminal and the output terminal of the second comparing unit (COMP12) are initialized.

The second control signal (CS12) is set to a low potential during an initializing period when the first control signal (CS11) is set to a high potential, so that the fourth switch (SW14) is turned off. And, because the third control signal (CS13) is set to a low potential, the fifth switch (SW15) is turned on, and the sixth switch (SW16) is turned off.

As the fifth switch (SW15) is turned on during the Nth initializing period, an output signal (OUT_SIG) of the third comparing unit (COMP13) is raised as high as a level of a source voltage (VDD) to be precharged. Accordingly, a voltage of the output signal (OUT_SIG) of the third comparing unit (COMP13) becomes higher than a voltage of an analog signal (ANALOG_SIG) charged on the first capacitor (C11).

As mentioned above, in order to calibrate an error due to electrical property differences of transistors in the first and second comparing units (COMP11, COMP12), during the Nth initializing period, an offset voltage is charged onto the first and second capacitors (C11, C12), the input terminal and the output terminal of the first comparing unit (COMP11) and the input terminal and the output terminal of the second comparing unit (COMP12) are initialized, and an output signal (OUT_SIG) of the third comparing unit (COMP13) is precharged as high as a level of the source voltage (VDD). Accordingly, the Nth initializing period can be defined as a first offset period.

Also, the fourth switch (SW14) is turned on during an Nth signal-applied period when the second control signal (CS12) is applied with a high potential, so that the analog signal (ANALOG_SIG) charged at the first capacitor (C11) is applied to a data line (D11) as an output signal (OUT_SIG) through the fourth switch (SW14).

During the Nth signal-applied period when the second control signal (CS12) is applied with a high potential, the first control signal (CS11) is applied with a low potential so that the first to third switches (SW11, SW12. SW13) are turned off. Also, the third control signal (CS13) has a high potential period and a low potential period in the Nth signal-applied period, thereby alternately turning on or off the fifth and the sixth switches (SW15, SW16).

During the high potential period of the third control signal (CS13), the sixth switch (SW16) is turned on, and the fifth switch (SW15) is turned off. On the contrary, during the low potential period of the third control signal (CS13), the sixth switch (SW16) is turned off and the fifth switch (SW15) is turned on.

Accordingly, an input voltage of the third comparing unit (COMP13) is pulled up during a period when the third control signal (CS13) is applied with a high potential in the Nth signal-applied period, so that a voltage of the output signal (OUT_SIG) of the third comparing unit (COMP13), which is precharged with a voltage level of the source voltage (VDD) by driving the first and second comparing units (COMP11, COMP12) during the above mentioned Nth initializing period, becomes the same as a voltage of the analog signal (ANALOG_SIG) charged onto the first capacitor (C11), to thereby turn on the second N-type MOS transistor (NM12) of FIG. 5. Because the sixth switch (SW16) has been turned on by the third control signal, a voltage of an output signal (OUT_SIG) of the third comparing unit (COMP13) is discharged to a ground potential (VSS) until the voltage becomes the same as the voltage of the analog signal (ANALOG_SIG) charged at the first capacitor (C11).

When the voltage of the output signal (OUT_SIG) of the third comparing unit (COMP13), discharged to the ground potential (VSS) becomes the same as or lower than the voltage of the analog signal (ANALOG_SIG) charged at the first capacitor (C11), the first and second comparing units (COMP11, COMP12) are driven and thus pull down an input voltage of the third comparing unit (COMP13). Accordingly, the second N-type MOS transistor (NM12) of FIG. 5 is turned off, and thus the discharge of the voltage of the output signal (OUT_SIG) of the third comparing unit (COMP13) is completed.

As mentioned above, during the period that the third control signal (CS13) is applied as a high potential in the Nth signal-applied period, the sixth switch (SW16) is turned on by the third control signal (CS13), and the first and second comparing units (COMP11, COMP12) are driven to pull up an input voltage of the third comparing unit (COMP13), to thereby turn on the second N-type MOS transistor of FIG. 5. Accordingly, the voltage of the output signal (OUT_SIG) of the third comparing unit (COMP13) is discharged to the ground potential (VSS) until it becomes the same as the voltage of the analog signal (ANALOG_SIG) charged at the first capacitor (C11). For this reason, the period that the third control signal (CS13) is applied as a high potential in the Nth signal-applied period may be defined as a discharge period. At this time, the discharging-completed voltage of the output signal (OUT_SIG) of the third comparing unit (COMP13) may overshoot a desired data voltage.

In order to compensate the overshooting voltage of the output signal (OUT_SIG) of the third comparing unit (COMP13), during a period when the third control signal (CS13) is applied with a low potential in the Nth signal-applied period, the sixth switch (SW16) is turned off, and the fifth switch (SW15) is turned on, so that a voltage of the output signal (OUT_SIG) of the third comparing unit (COMP13) is charged as high as a certain level. Accordingly, the voltage of the output signal (OUT_SIG) of the third comparing unit is properly compensated so that an accurate data voltage is output.

As described above, during the period that the third control signal (CS13) is applied with a low potential in the Nth signal-applied period, the sixth switch (SW16) is turned off, and the fifth switch (SW15) is turned on, so that the voltage of the output signal (OUT_SIG) of the third comparing unit (COMP13) is charged as high as a certain level. Accordingly, the voltage of the output signal (OUT_SIG) of the third comparing unit is properly compensated so that an accurate data voltage is output. For this reason, the period when the third control signal (CS13) is applied with a low potential in the Nth signal-applied period may be defined as a second offset period.

An analog signal (ANALOG_SIG) applied to an analog buffer in accordance with the present invention as described above is applied by an inversion method in order to prevent deterioration of an image such as a flicker.

Accordingly, during an N+1th initializing period, the first switch (SW11) is turned on so that an inverted analog signal (ANALOG_SIG) is charged at the first capacitor (C11), and the second switch (SW12) is turned on so that an input terminal and an output terminal of the first comparing unit (COMP11) are initialized.

In addition, as the second switch (SW12) is turned on, the inverted analog signal (ANALOG_SIG) is charged on to the second capacitor (C12), and the third switch (SW13) is turned on so that an input terminal and an output terminal of the second comparing unit (COMP12) are initialized.

During an initializing period when the first control signal (CS11) is applied with a high potential, the second control signal (CS12) is applied with a low potential so that the fourth switch (SW14) is turned off, and the third control signal (CS13) is applied with a high potential so that the fifth switch (SW15) is turned off, and the sixth switch (SW16) turned on.

As the sixth switch (SW16) is turned on during the N+1th initializing period, an output signal (OUT_SIG) of the third comparing unit (COMP13) is discharged as high as a level of a ground potential (VSS). Thus, the voltage of the output signal (OUT_SIG) of the third comparing unit (COMP13) becomes lower than a voltage of the inverted analog signal (ANALOG_SIG) of the first capacitor (C11).

As mentioned above, in order to calibrate an error due to electrical property differences of transistors in the first and second comparing units (COMP1, COMP12), during the N+1th initializing period, an offset voltage is charged onto the first and second capacitors (C11, C12), the input terminal and the output terminal of the first comparing unit (COMP11) and the input terminal and the output terminal of the second comparing unit (COMP12) are initialized, the output signal (OUT_SIG) of the third comparing unit (COMP13) are discharged as high as a level of the ground potential (VSS). Accordingly, the N+1th initializing period may be defined as a first offset period.

During an N+1th signal-applied period that a second control signal (CS12) is applied with a high potential, the fourth switch (SW14) is turned on so that an inverted analog signal (ANALOG_SIG) of the first capacitor (C11) is applied to a data line (D11) as an output signal (OUT_SIG) through the fourth switch (SW14).

The first control signal (CS11) is applied with a low potential during the N+1th signal-applied period that the second control signal (CS12) is applied as a high potential, so that the first to third switches (SW11, SW12, SW13) are turned off. Because the third control signal (CS13) has a low potential period and a high potential period during the N+1th signal-applied period, the fifth and sixth switches (SW14, SW16) are alternately turned on or off.

If the sixth switch (SW16) is turned off, then the fifth switch (SW16) is turned on during the low potential period of the third control signal (CS13). On the contrary, if the sixth switch (SW16) is turned on, then the fifth switch (SW15) is turned off during the high potential period of the third control signal (CS13).

Accordingly, an input voltage of the third comparing unit (COMP13) is pulled down during the period that the third control signal (CS13) is applied with a low potential in the N+1th signal-applied period, so that a voltage of an output signal (OUT_SIG) of the third comparing unit (COMP13), which is discharged as high as a level of a ground potential (VSS) by driving of the first and second comparing units (COMP11, COMP12) during the above-mentioned N+1th initializing period, becomes the same as a voltage of an inverted analog signal (ANLOG_SIG) of the first capacitor (C11), to thereby turn on the second P-type MOS transistor of FIG. 5. Because the fifth switch (SW15) has been turned on by the third control signal (CS13), a voltage of the output signal (OUT_SIG) of the third comparing unit (COMP13) is charged by a source voltage (VDD) until it becomes the same as a voltage of the inverted analog signal (ANALOG_SIG) of the first capacitor (C11).

When the voltage of the output signal (OUT_SIG) of the third comparing unit (COMP13), charged by the source voltage (VDD) becomes the same as or higher than the voltage of the inverted analog signal (ANALOG_SIG) of the first capacitor (C11), the first and second comparing units (COMP11, COMP12) are driven so that an input voltage of the third comparing unit (COMP13) is pulled up. Accordingly, the second P-type MOS transistor (PM12) of FIG. 5 is turned off, thereby completing the charge of the voltage of the output signal (OUT_SIG) of the third comparing unit (COMP13).

As discussed above, during the period that the third control signal (CS13) is applied with a low potential in the N+1th signal-applied period, the fifth switch (SW15) is turned on by the third control signal (CS13), an input voltage of the third comparing unit (COMP13) is pulled down by driving of the first and second comparing units (COMP11, COMP12), to thereby turn on the second P-type MOS transistor (PM12) of FIG. 5. Accordingly, the voltage of the output signal (OUT_SIG) of the third comparing unit (COMP13) is charged by a source voltage (VDD) until it becomes the same as a voltage of the inverted analog signal (ANALOG_SIG) of the first capacitor (C11). For this reason, the period that the third control signal (CS13) is applied as a low potential in the N+1th signal-applied period may be defined as a charging period. Here, the charging-completed voltage of the output signal (OUT_SIG) of the third comparing unit (COMP13) may overshoot a desired data voltage.

In order to compensate the overshooting voltage of the output signal (OUT_SIG) of the third comparing unit (COMP13), during a period that the third control signal (CS13) is applied as a high potential in the N+1th signal-applied period, the sixth switch (SW16) is turned on, and the fifth switch (SW15) is turned off, so that a voltage of the output signal (OUT_SIG) of the third comparing unit (COMP13) is discharged to a ground potential (VSS) as high as a certain level. Accordingly, the voltage of the output signal (OUT_SIG) of the third comparing unit (COMP13) is properly compensated so that an accurate data voltage is output.

As above, during the period that the third control signal is applied with a high potential in the N+1th signal-applied period, the sixth switch (SW16) is turned on, and the fifth switch (SW15) is turned off, so that the voltage of the output signal (OUT_SIG) of the comparing unit (COMP13) is discharged to the ground potential (VSS) as high as a certain level. Accordingly, the voltage of the output signal (OUT_SIG) of the third comparing unit (COMP13) is properly compensated so that an accurate data voltage is output. Thus, the period that the third control signal is applied as a high potential in the N+1th signal-applied period may be defined as a second offset period.

An analog buffer in accordance with the present invention may be provided at a gate driving unit or a data driving unit mounted in a driving circuit-integrated liquid crystal display device, and particularly, at an output terminal of the data driving unit which applies an image signal to a data line of the liquid crystal display device.

In addition, the analog buffer in accordance with the present invention may be provided at a signal line driving unit of various flat panel display devices such as a plasma display panel (PDP), a field emission display (FED), or an electroluminescence display (ELD) which substitute for a cathode ray tube (CRT), and particularly, at an output terminal of a signal line driving unit applying an image signal to a signal line of a flat panel display device.

In an analog buffer and a method for driving the same, by providing a pair of switches at a last comparing unit, a voltage level of an output signal is precharged as high as a source voltage level during a first offset period in an Nth initializing period, the voltage level of the output signal is discharged as high as a voltage level of a desired data signal during a discharging period in an Nth signal-applied period, then, the discharged voltage of the output signal, which overshoots a desired data voltage is compensated during a second offset period in the Nth signal-applied period to thereby output an accurate data voltage. In addition, by providing the pair of switches at the last comparing unit, a voltage level of an output signal is discharged to a ground potential during a first offset period in an N+1th initializing period, the voltage level of the output signal is charged as high as a voltage level of the desired data signal during a charging period of an N+1th signal-applied period, then the charged voltage of the output signal, which overshoots a desired data voltage, is compensated during a second offset period to thereby output an accurate data voltage. Accordingly, by the analog buffer and the method for driving the same, a flat panel display device driven by an inversion method can correctly implement a desired color, and thus its image quality can be improved.

In addition, the transistors in the comparing units except the last comparing unit can be designed to have minimum sizes, so that a leakage current is minimized, and thus power consumption can be reduced. Also, even in case of the last comparing unit, the pair of switches cuts off a flow of a leakage current during first and second offset periods, thereby minimizing power consumption.

If the transistors in the last comparing unit are simultaneously turned on, the pair of switches cuts off between a source voltage and a ground potential, thereby preventing a circuit from being unstable such as oscillation or the like.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An analog buffer comprising:
   a first comparing unit calibrating a voltage change of a first output terminal upon receiving an analog signal through a first switch and a first capacitor;
   a second switch connected between a first input terminal and the first output terminal of the first comparing unit;
   a second comparing unit calibrating a voltage change of a second output terminal upon receiving a first output signal of the first comparing unit through a second capacitor;
   a third switch connected between a second input terminal and the second output terminal of the second comparing unit;
   a third comparing unit calibrating a voltage change of a third output terminal upon receiving an output signal of the second comparing unit;
   a fourth switch connected to the third output terminal of the third comparing unit and between the first switch and the first capacitor; and
   fifth and sixth switches that respectively supply a source voltage and a ground potential to the third comparing unit or that respectively cuts off the source voltage and the ground potential from the third comparing unit.

2. The analog buffer of claim 1, wherein the analog buffer is provided at a data driving unit mounted in a driving circuit-integrated liquid crystal display device.

3. The analog buffer of claim 1, wherein the third output terminal is coupled to a data line of a liquid crystal display device.

4. The analog buffer of claim 1, wherein the first to third switches are simultaneously turned on or off.

5. The analog buffer of claim 1, wherein the fourth switch is turned on or off in an opposite manner to the first to third switches.

6. The analog buffer of claim 1, wherein the fifth and sixth switches are alternately turned on or off.

7. The analog buffer of claim 1, wherein the first to fourth switches and the sixth switch include an N-type MOS transistor.

8. The analog buffer of claim 1, wherein the fifth switch includes a P-type MOS transistor.

9. The analog buffer of claim 1, wherein the first, second, and third comparing units respectively include one of an inverter or a voltage amplifier.

10. The analog buffer of claim 1, further comprising a resistance element between the output terminal of the third comparing unit and the line.

11. The analog buffer of claim 1, wherein the third comparing unit includes a first P-type MOS transistor and a first N-type MOS transistor which are connected in series between the fifth switch and the sixth switch and receive an output signal of the second comparing unit at their gate electrodes, wherein the output signal is output from a drain connection point of the first P-type MOS transistor and the first N-type MOS transistor.

12. A method for driving an analog buffer for calibrating a voltage change of an output signal through a first capacitor, a first comparing unit, a second capacitor, a second comparing unit and a third comparing unit, that are directly and sequentially connected, upon receiving an analog signal, and applying the calibrated output signal to a line, comprising:
   initializing an input terminal and an output terminal of the first comparing unit and an input terminal and an output terminal of the second comparing unit and precharging an output signal of the third comparing unit during an Nth initializing period;
   discharging a voltage of the output signal of the third comparing unit as a desired voltage during an Nth signal-applied period; and
   compensating the voltage of the output signal of the third comparing unit during the Nth signal-applied period.

13. The method of claim 12, further comprising:
   charging an offset voltage at the first and second capacitors, initializing the input terminal and the output terminal of the first comparing unit and the input terminal and the output terminal of the second comparing unit, and discharging the output signal of the third comparing unit during an N+1th initializing period;
   charging the voltage of an output signal of the third comparing unit as the desired voltage_during an N+1th signal-applied period; and
   compensating the voltage of the output signal of the third comparing unit during the N+1th signal-applied period.

* * * * *